(12) United States Patent
Torii et al.

(10) Patent No.: US 7,161,230 B2
(45) Date of Patent: Jan. 9, 2007

(54) INSULATED GATE BIPOLAR TRANSISTOR HAVING A HIGH SWITCHING SPEED AND METHOD FOR FABRICATING THE SAME

(75) Inventors: Katsuyuki Torii, Saitama (JP); Ryoji Takahashi, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 0 days.

(21) Appl. No.: 10/994,064

(22) Filed: Nov. 19, 2004

(65) Prior Publication Data

US 2005/0110076 A1    May 26, 2005

(30) Foreign Application Priority Data

Nov. 20, 2003    (JP)    ............... 2003-390080

(51) Int. Cl.
*H01L 27/082*    (2006.01)
(52) U.S. Cl. ............... 257/565; 257/E27.055; 438/133
(58) Field of Classification Search ............ None
See application file for complete search history.

(56) References Cited

U.S. PATENT DOCUMENTS 3,664,896 A * 5/1972 Duncan
6,448,588 B1 * 9/2002 Yun et al.

FOREIGN PATENT DOCUMENTS

JP    05-055583    3/1993

* cited by examiner

*Primary Examiner*—Nathan J. Flynn
*Assistant Examiner*—Kevin Quinto
(74) *Attorney, Agent, or Firm*—Townsend and Townsend and Crew LLP

(57) ABSTRACT

An insulated gate bipolar transistor has a P-type collector region containing a P-type impurity such as boron. A relatively thin N-type buffer region containing arsenic in a relatively high concentration is formed on the collector region via an anti-diffusion region. The anti-diffusion region is provided in such a way that its thickness is the same as or slightly smaller than the distance over which the P-type impurity is diffused from the collector region toward the buffer region in a device fabrication process.

16 Claims, 4 Drawing Sheets

INSULATED GATE BIPOLAR TRANSISTOR HAVING A HIGH SWITCHING SPEED AND METHOD FOR FABRICATING THE SAME

CROSS-REFERENCES TO RELATED APPLICATIONS

The present invention claims priority to Japanese Application No.2003-390080, filed on Nov. 20, 2003, and is incorporated herein by this reference.

BACKGROUND OF THE INVENTION

1. Field of the Invention

The present invention relates to an insulated gate bipolar transistor and a method of fabricating the same.

2. Description of the Related Art

An insulated gate bipolar transistor (hereinafter referred to as IGBT) has high input impedance of a field effect transistor and a high current drive capability of a bipolar transistor, and is particularly suitable for use as a power switching device.

An IGBT has such a problem that as the density of current flowing through the device increases, the parasitic thyristor is turned on so that the device is likely to go to a latch-up state in which case the device may be broken. To suppress the occurrence of the latch-up, a device with a buffer region is developed as disclosed in Unexamined Japanese Patent Application KOKAI Publication No. H5-55583.

The conventional IGBT with a buffer region has a semiconductor substrate, a collector electrode, an emitter electrode, a gate insulating layer, and a gate electrode. The semiconductor substrate includes a P-type collector region, an N$^+$-type buffer region having a relatively high impurity concentration formed on the collector region, an N-type base region having a relatively low impurity concentration formed on the buffer region, a P-type base region provided like lands in the surface region of the N-type base region, and an N-type emitter region provided like lands in the surface region of the P-type base region.

The collector electrode is electrically connected to the collector region. The emitter electrode is electrically connected to the emitter region. The gate electrode is formed on the P-type base region, sandwiched between the N-type base region and the emitter region, via the gate insulating layer.

In the IGBT, the buffer region has a capability of optimizing (suppressing) the amount of holes to be injected into the N-type base region from the collector region and preventing the latch-up. When the N-type base region is formed directly on the collector region with no buffer region formed, more than necessary holes are injected into the N-type base region from the collector region, making the occurrence of the latch-up easier. The buffer region suppresses the latch-up and improves the reliability of the device.

The IGBT with the buffer region however has a problem such that the so-called tail current is large so that the switching speed is apt to become slower. This seems to be attributed to the following reason. When the device is turned off with the voltage to be applied to the gate electrode being set equal to or lower than a threshold voltage Vth, the PN junction formed at the interface between the N-type base region and the P-type base region is reverse-biased, causing the depletion layer to extend into the N-type base region from the PN junction. At this time, minority carriers (holes) stored in the N-type base region are discharged via the P-type base region. As the depletion layer does not substantially extend into the buffer region, however, the carriers stored in the buffer region are not discharged. Accordingly, the current (tail current) keeps flowing until the minority carriers stored in the buffer region are recombined. As a result, the switching speed of the IGBT becomes slower.

The buffer region of the IGBT is generally formed of phosphorus. As phosphorus is likely to be diffused into the semiconductor region, however, the phosphorus in the buffer region may be diffused into the N-type base region by the heat generated in the fabrication process of the semiconductor device. When the device is completed as an IGBT, therefore, the buffer region is formed thick with a relatively low impurity concentration. Consequently, the completed IGBT becomes more likely to store holes in the buffer region and takes a longer time to get the holes recombined to vanish, allowing the tail current to be large.

One way to solve the problem is to form the buffer region thin beforehand in consideration of heat-originated diffusion. In this case, however, the impurity concentration of the buffer region should be made higher. This results in sharp concentration gradient with respect to another adjoining layer, causing diffusion of a greater amount of phosphorus. Therefore, the buffer region eventually becomes thick and the impurity concentration cannot be increased sufficiently. In other words, the problem that the tail current is likely to become large is not solved.

On the other hand, there are methods for applying electron irradiation, heavy metal diffusion, or the like, for decreasing the tail current. However, these methods cause defects inside the device, which leads to degradation of device characteristics, such as increase in collector-emitter voltage VCE (sat), which is a critical characteristic of an IGBT, decrease in threshold voltage Vth, and increase in leak current when a reverse voltage is applied between the collector and the emitter. These methods cause not only such degradation of device characteristics, but also other bad effects such as large change in device characteristics at a high working temperature. Furthermore, these methods give rise to a problem that the frequency of occurrence of switching loss is greatly increased during device operation at a high temperature.

In view of the situation, the present inventors have developed a scheme of forming a buffer region using arsenic (As) as a donor impurity as disclosed in a copending Japanese patent application filed at the Japanese Patent Office and not published yet. According to the scheme, the use of arsenic having a diffusion coefficient lower by about one figure than that of phosphorus can increase the impurity concentration of the buffer region ($5\times10^{17}$ cm$^{-3}$ or higher) and make the buffer region thinner (2 to 10 μm). This can reduce the amount of carriers to be stored in the buffer region and can thus reduce the tail current. That is, forming the buffer region containing arsenic at a relatively high concentration relatively thick achieves a device which has a reduced tail current, thereby improving the speed, and adequately prevents the latch-up.

When the buffer region containing arsenic as a donor impurity was formed on the collector region containing boron as an acceptor impurity after which a device fabrication process such as formation of an N-type base region or so was performed according to the scheme, however, there was a phenomenon observed in which boron in the collector region was diffused over the buffer region into the N-type base region. After device fabrication, the diffusion of boron over the buffer region changes the impurity concentration in the N-type base region.

This phenomenon occurs for the diffusion coefficient of boron is greater by about one figure than that of arsenic. As boron in the collector region is diffused over the buffer region into the N-type base region, the breakdown voltage characteristic follows the channel pattern undesirably. The channel pattern is the phenomenon that the leak current becomes greater when a relatively low reverse voltage is applied. When the breakdown voltage characteristic follows the channel pattern, the breakdown voltage distribution becomes non-uniform, bringing about a reduction in breakdown voltage which would impair the reliability of the device.

As mentioned above, an IGBT having a buffer region containing arsenic can achieve a high switching speed and a good latch-up resistance. When the diffusivity of the impurity contained in the collector region is high, however, the breakdown voltage drops as the impurity is diffused over the relatively thin buffer region, which may impair the reliability of the device.

BRIEF SUMMARY OF THE INVENTION

To overcome the problems, the present invention aims at providing an insulated gate bipolar transistor having a high reliability and a high switching speed, and a method of fabricating the transistor. It is another object of the invention to provide an insulated gate bipolar transistor, which has an arsenic-contained buffer region and has a high reliability and a high switching speed, and a method of fabricating the transistor.

To achieve the object, according to the first aspect of the present invention, there is provided an insulated gate bipolar transistor which includes:

a P-type collector region containing a P-type impurity;

an N-type buffer region formed on the P-type collector region;

an N-type base region formed on the N-type buffer region and having a lower impurity concentration than the N-type buffer region;

a P-type base region formed in a surface region of the N-type base region;

an N-type emitter region formed in a surface region of the N-type base region; and an anti-diffusion region formed between the P-type collector region and the N-type buffer region in such a way as to prevent diffusion of the P-type impurity of the P-type collector region.

To achieve the object, according to the second aspect of the present invention, there is provided a method of fabricating an insulated gate bipolar transistor which comprises the steps of:

forming an anti-diffusion region on a P-type collector region containing a P-type impurity to prevent diffusion of the P-type impurity in a device fabrication process;

forming an N-type buffer region on the anti-diffusion region;

forming an N-type base region having a lower impurity concentration than the N-type buffer region on the N-type buffer region;

forming a P-type base region in a surface region of the N-type base region by impurity diffusion; and forming an N-type emitter region in a surface region of the N-type base region by impurity diffusion.

The present invention can provide an insulated gate bipolar transistor having a high reliability and a high switching speed, and a method of fabricating the transistor. The invention can further provide an insulated gate bipolar transistor, which has an arsenic-contained buffer region and has a high reliability and a high switching speed, and a method of fabricating the transistor.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE INVENTION

An insulated gate bipolar transistor (hereinafter referred to as IGBT) according to a preferred embodiment of the present invention will be described below in detail with reference to the accompanying drawings.

Figure 1:
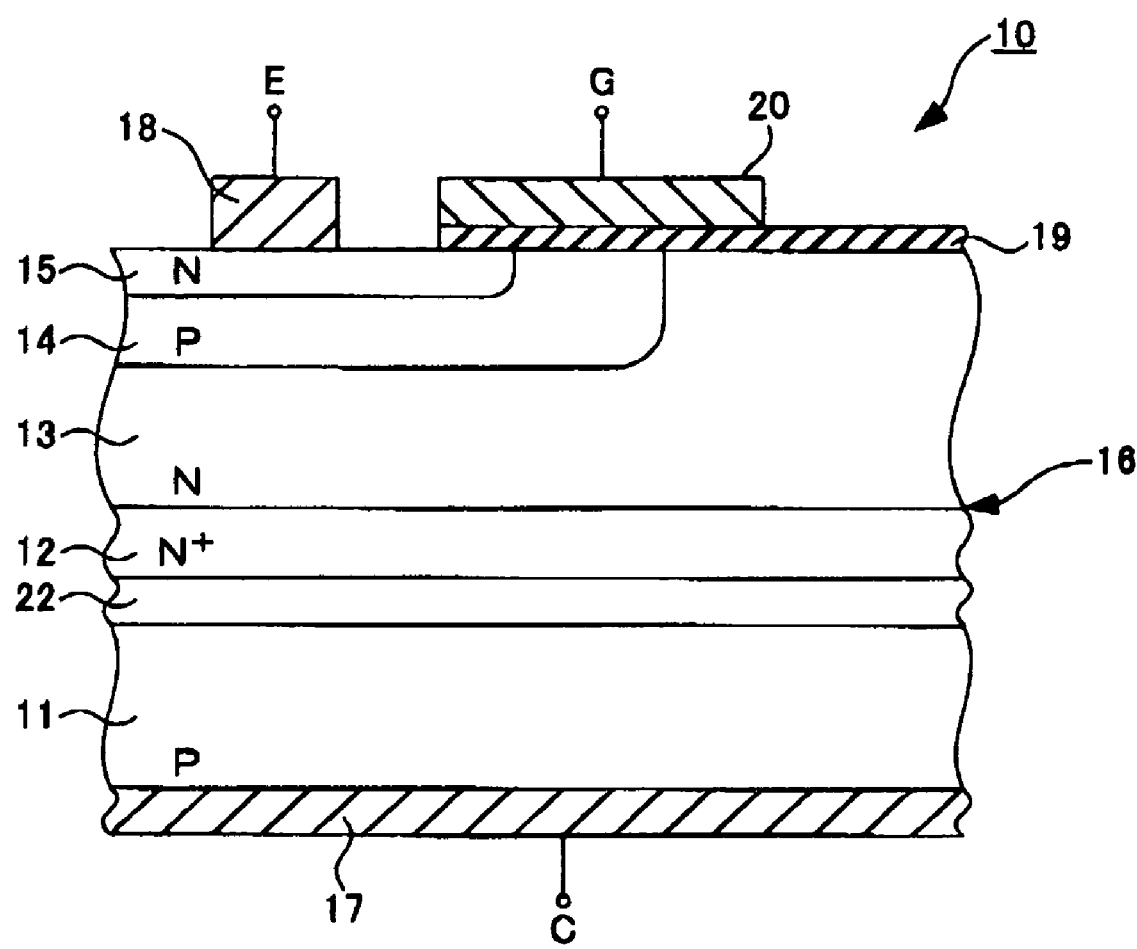
FIG. 1 is a diagram illustrating the cross-sectional structure of an IGBT according to one embodiment of the present invention.

FIG. 1 shows the cross section of an IGBT 10 according to the embodiment. The IGBT 10 shown in FIG. 1 includes a semiconductor substrate 16, a collector electrode 17, an emitter electrode 18, an insulating layer 19 and a gate electrode 20. The semiconductor substrate 16 has a P-type collector region 11, an anti-diffusion region 22, a buffer region 12, an N-type base region 13, at least one P-type base region 14 and an emitter region 15.

The collector region 11 is comprised of a P-type semiconductor region containing boron as a P-type impurity, e.g., a P-type silicon semiconductor substrate. The collector region 11 is formed, for example, with a thickness of 100 μm to 300 μm and at an impurity concentration of about $1 \times 10^{18}$ cm$^{-3}$. The collector region 11 constitutes one surface of the semiconductor substrate 16 on which one surface the collector electrode 17 of aluminum or so is provided.

The anti-diffusion region 22 is comprised of a non-doped silicon layer formed on one surface of the collector region 11. The anti-diffusion region 22 is formed by epitaxial growth which substantially uses no impurity (acceptor impurity). As will be discussed later, the anti-diffusion region 22 is provided to prevent diffusion of boron of the collector region 11 toward the buffer region 12 in the device fabrication process of the N-type base region 13, etc.

The anti-diffusion region 22 is formed with a thickness equal to or slightly smaller than the distance over which boron is diffused toward the buffer region 12 in the device fabrication process. The anti-diffusion region 22 should preferably be provided in such a way as to stop diffusion of boron from the collector region 11 within the buffer region 12, more preferably to stop in the vicinity of the interface between the buffer region 12 and the anti-diffusion region 22. That is, boron from the collector region 11 is diffused into the anti-diffusion region 22 almost entirely, so that the anti-diffusion region 22 does not substantially have a non-doped region. The anti-diffusion region 22 is formed with a thickness of, for example, 2 μm or greater.

The buffer region 12 is comprised of a an N-type semiconductor region formed on one surface of the anti-diffusion region 22. The buffer region 12 is formed on the semiconductor substrate constituting the collector region 11 by epitaxial growth. The buffer region 12 contains arsenic (As) preferably at a concentration of $5 \times 10^{17}$ cm$^{-3}$ or greater. It is desirable that the donor impurity concentration of the buffer region 12 should be set higher than the concentration of the acceptor impurity of the collector region 11. The buffer region 12 is formed with a thickness of, specifically, 2 to 10 μm, preferably 5 μm or less.

The N-type base region 13 is comprised of an N-type semiconductor region containing an N-type impurity such as phosphorus. The N-type base region 13 is formed on the buffer region 12 by epitaxial growth. The N-type base region 13 is formed at an impurity concentration of, for example, $1\times10^{14}$ cm$^{-3}$ or so and with a thickness of, for example, 50 μm or so.

One P-type base region 14 or plural P-type base regions 14 are formed like lands in the surface region of the N-type base region 13, and each comprised of an impurity diffusion region having a P-type impurity such as boron diffused therein. The P-type base region 14 is formed at an impurity concentration of, for example, $1\times10^{17}$ cm$^{-3}$ or so and at a diffusion depth of, for example, 4 μm or so.

The emitter region 15 is formed in the surface region of the P-type base region 14 and is comprised of an impurity diffusion region into which an N-type impurity such as phosphorus is diffused. The emitter region 15 is formed at an impurity concentration of, for example, $1\times10^{19}$ cm$^{-3}$ or so and at a diffusion depth of, for example, 0.5 μm or so. The emitter region 15 is electrically connected to the emitter electrode 18 made of aluminum or so.

The collector electrode 17, which is made of aluminum or so, is formed on one surface of the collector region. The emitter electrode 18, which is made of aluminum or so, is electrically connected to the emitter region. The gate electrode 20, made of polysilicon or so, is formed on the P-type base region 14 (channel region) sandwiched between the emitter region 15 and the N-type base region 13, via the gate insulating layer 19.

In the IGBT 10 with the above-described structure, the buffer region 12 is provided to restrain occurrence of the latch-up of the device and enhance the reliability of the device.

The "latch-up" is the following phenomenon. A parasitic NPN transistor comprised of the N-type base region 13, the P-type base region 14, and the N-type emitter region 15, is formed in the IGBT 10. The parasitic NPN transistor, together with a PNP transistor comprised of the collector region 11, the buffer region 12, the N-type base region 13 and the P-type base region 14, forms a parasitic thyristor. If the thyristor operates, the current that flows through the thyristor cannot be inhibited when the IGBT 10 is off, and the IGBT 10 causes thermal runaway and is damaged.

If the N-type base region 13 is formed directly on the collector region 11 without forming the buffer region 12, more than necessary holes are injected into the N-type base region 13 from the collector region 11, making the occurrence of latch-up easier. With the buffer region 12 formed, however, when a voltage equal to or lower than a threshold voltage Vth is applied between the collector and emitter of the IGBT 10 in the off state, the buffer region 12 optimizes (suppresses) the amount of holes to be injected into the N-type base region 13 from the collector region 11 in the off process. The provision of the buffer region 12 can therefore suppress occurrence of the latch-up and improve the reliability of the device.

The provision of the buffer region 12 generally slows down the switching speed of the IGBT 10. That is, when the IGBT 10 is off, the PN junction formed at the interface between the N-type base region 13 and the P-type base region 14 is reverse-biased and the depletion layer extends into the N-type base region 13 from the PN junction. At this time, the carriers (holes) stored in the N-type base region 13 are discharged from the emitter electrode 18 via the P-type base region 14. Because the depletion layer does not substantially extend into the buffer region 12, however, the carriers stored in the buffer region 12 are not discharged. Accordingly, the current (so-called tail current) keeps flowing until the carriers stored in the buffer region 12 are recombined. As a result, the switching speed of the IGBT 10 becomes slow.

To reduce the carriers to be stored in the buffer region 12, therefore, it is preferable that the buffer region 12 should be as thin as possible. To accelerate the recombination of the carriers stored in the buffer region 12, it is preferable to set the impurity concentration of the buffer region 12 high. However, phosphorus which is used in the buffer region 12 generally has a high diffusion coefficient in the semiconductor region and is diffused in the heat treatment in the device fabrication process. This makes it difficult to form the buffer region 12 thin and at a high impurity concentration.

In this respect, the buffer region 12 in the IGBT 10 according to the embodiment is formed by using arsenic. This restrains substantial enlargement of the buffer region 12 which would be originated from the diffusion of the impurity (arsenic) in the heat treatment in the device fabrication process.

To be more specific, the diffusion coefficient of arsenic is lower than that of phosphorus by about one figure. Therefore, the buffer region 12 is prevented from being formed thick, which thickening is due to the donor impurity being diffused over the N-type base region 13 in the heat treatment carried out for forming the N-type base region 13, the P-type base region 14, the emitter region 15, etc., which are formed after the buffer region 12 is formed. This can reduce the amount of holes stored in the buffer region 12 when the device is off, thereby reducing the tail current. This results in a higher switching speed.

As the solid solubility of arsenic into silicon is equal to or higher than the solid solubility of phosphorus, the buffer region 12 at a high impurity concentration, preferably $5\times10^{17}$ cm$^{-3}$ or higher, can be formed by using arsenic. Even when the buffer region 12 is formed relatively thin, for example, with a thickness of 2 to 5 μm, injection of holes is effectively suppressed, thus preventing the latch-up. The thin formation of the buffer region 12 can further reduce the storage amount of the carriers, so that the switching speed can be increased while maintaining the high device reliability.

As the buffer region 12 is formed by epitaxial growth, the gradient of the impurity concentration can be made sharper as compared with the case where the buffer region 12 is formed by impurity diffusion. That is, the interface between the collector region 11 and the buffer region 12 can be made into a so-called step junction, so that the thin buffer region 12 can suppress injection of holes more effectively and further enhance the latch-up resistance.

Because the use of arsenic in the buffer region 12 therefore eliminates the necessity of electron irradiation or the like to reduce the tail current, therefore, defects or so in the device by electron irradiation or the like does not occur. It is therefore possible to reduce the tail current or improve the switching speed without bringing about undesirable states, such as a rise in collector-emitter voltage VCE(sat), reduction in threshold voltage Vth, and increase in leak current. In addition, the problem that the switching loss frequently occurs when the device operates at a high temperature does not occur.

The device where the buffer region 12 is formed by using arsenic does not particularly require a complicated step and can be accomplished in the same step as involved in the case of using another impurity such as phosphorus.

Further, the IGBT 10 according to the embodiment has the anti-diffusion region 22 formed between the collector region 11 and the buffer region 12 to prevent diffusion of a P-type impurity from the collector region 11.

Figure 3:
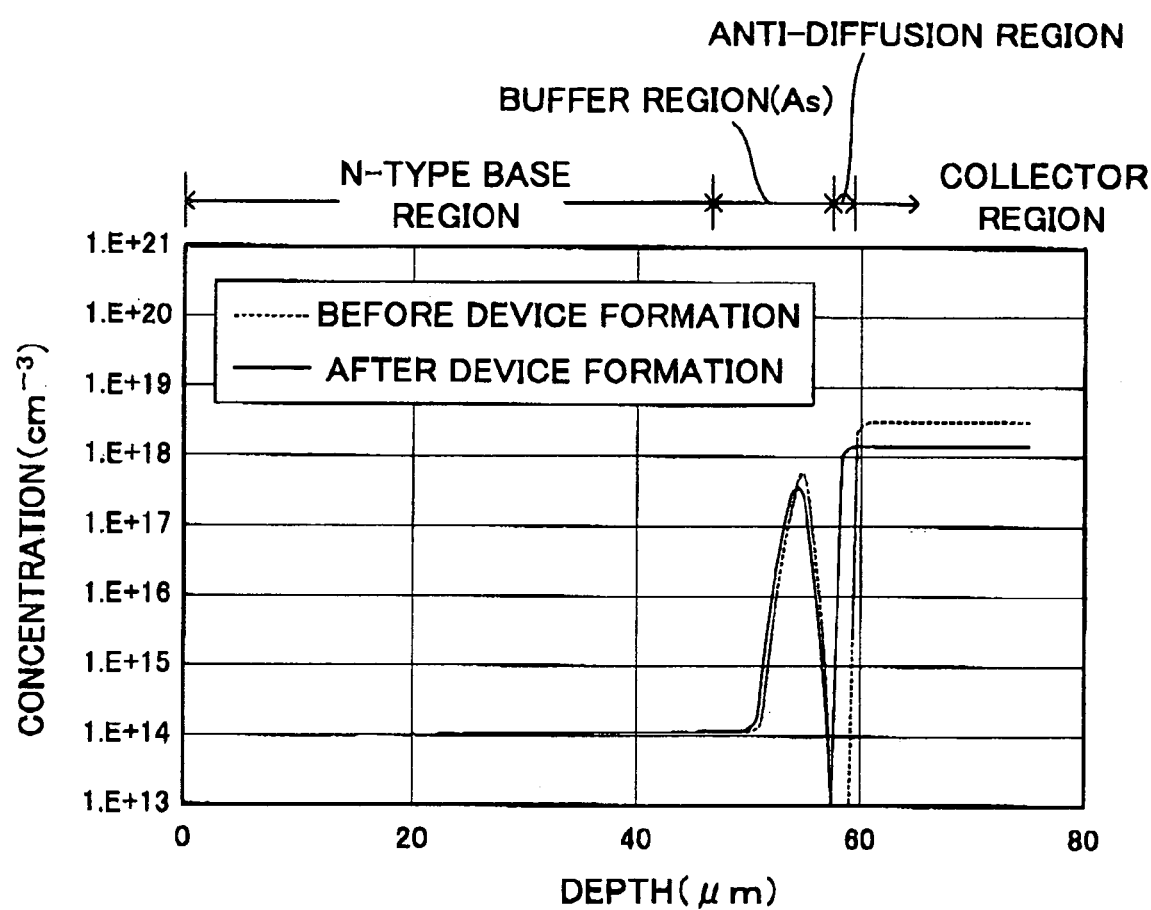
FIG. 3 is a diagram showing how boron is diffused before and after a heat treatment when the present invention is adapted.

When the buffer region 12 is formed directly on the collector region 11, for example, the diffusion coefficient of boron is greater by one figure or so than that of arsenic. After the device fabrication process is completed, therefore, boron is diffused over the buffer region 12 into the N-type base region 13 so that the N-type impurity concentration substantially changes, as shown in FIG. 3. When boron is diffused into the N-type base region 13 this way, the breakdown voltage characteristic follows the channel pattern, making the breakdown voltage distribution non-uniform. This reduces the breakdown voltage and lowers the reliability of the device.

The anti-diffusion region 22 is formed in such a way as to stop diffusion of boron in the device fabrication process within the buffer region 12, preferably in the vicinity of the interface between the buffer region 12 and the anti-diffusion region 22, and can prevent the reduction in breakdown voltage.

The employment of the above-described structure can provide the IGBT 10 which has the thin buffer region 12 even after the device is completed, and has the desired high latch-up resistance and high switching characteristic, and a high reliability.

A method of fabricating the IGBT 10 with the structure will be described referring to the accompanying drawings. FIGS. 2A to 2E illustrate the fabrication process for the IGBT 10 according to the embodiment. The illustrated fabrication process is just an example, and is not restrictive as long as a similar device is obtained.

Figure 2A:
FIGS. 2A to 2E are diagrams illustrating a fabrication process for the IGBT according to the embodiment of the present invention.
Figure 2B:
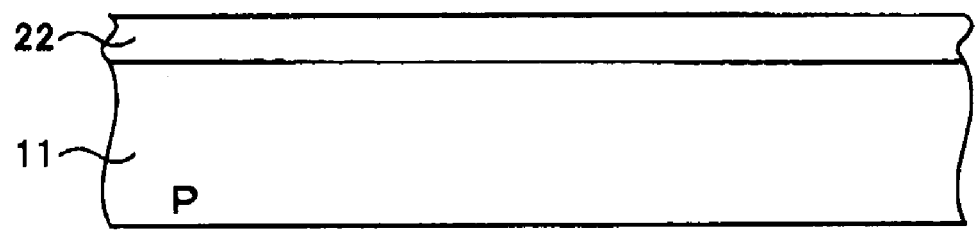
Figure 2C:
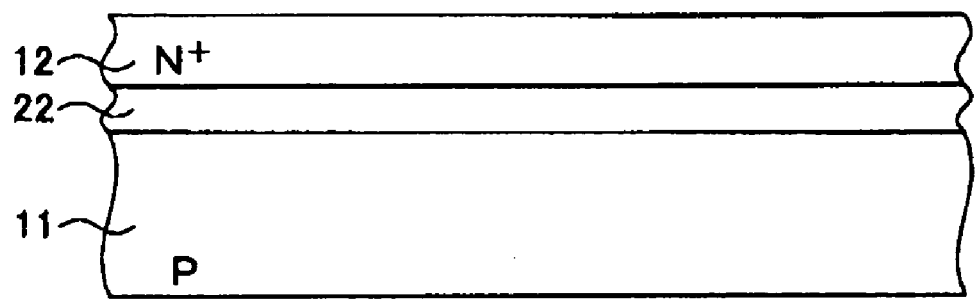

First, a boron-doped P-type semiconductor substrate 30 is prepared as shown in FIG. 2A. Next, a non-doped epitaxial layer (anti-diffusion region 22) is formed on the semiconductor substrate 30 by general epitaxial growth without substantially doping an impurity, as shown in FIG. 2B. Then, an epitaxial growth layer (buffer region 12) containing arsenic as an N-type impurity is formed by similar epitaxial growth, as shown in FIG. 2C.

Figure 2D:
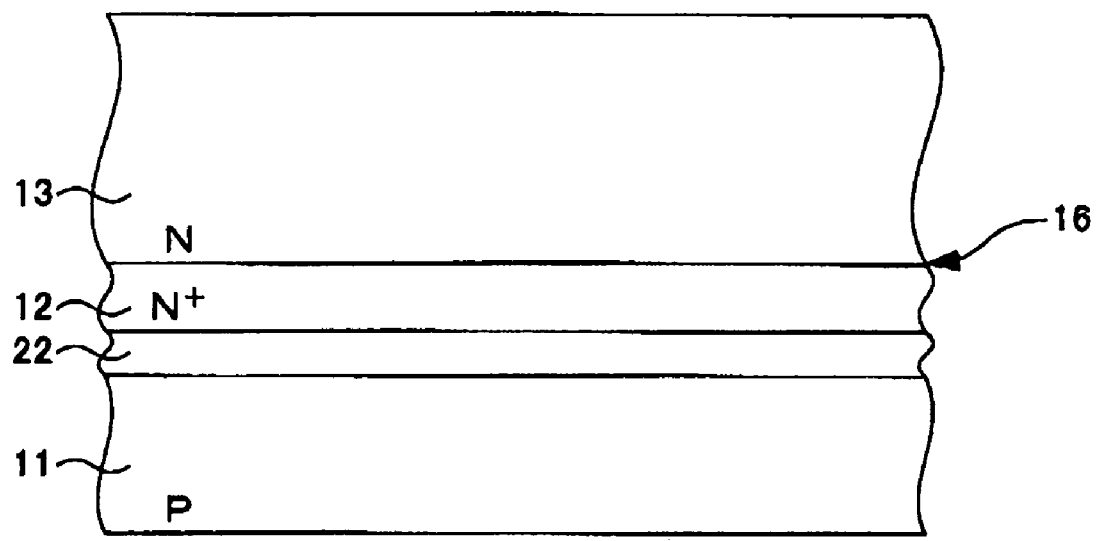

Next, as shown in FIG. 2D, the N-type base region 13 containing an N-type impurity such as phosphorus is formed on the buffer region 12 by using epitaxial growth. The anti-diffusion region 22, the buffer region 12 and the N-type base region 13 may be formed continuously within the same fabrication apparatus.

Figure 2E:
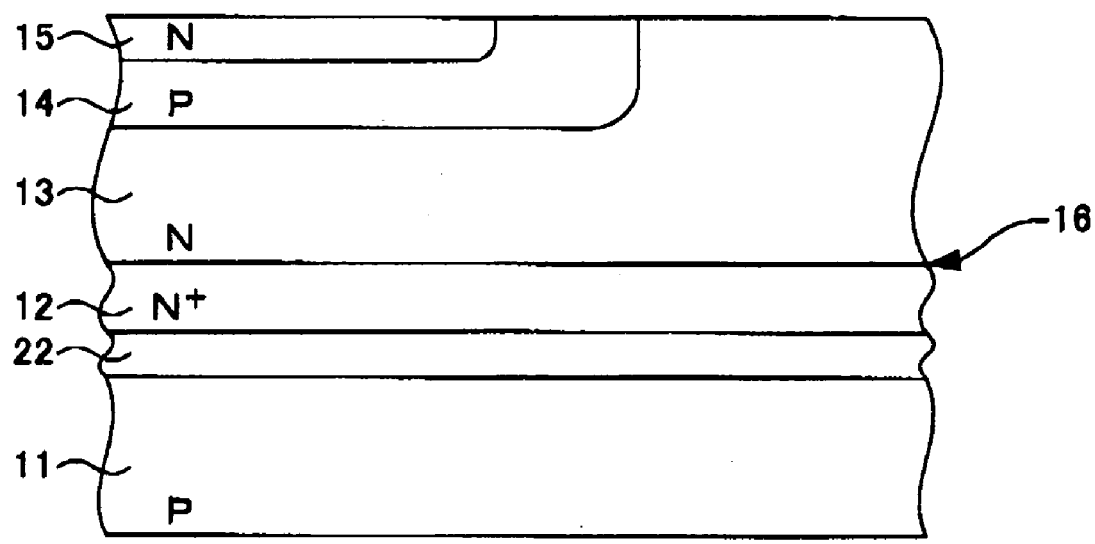

Next, a P-type impurity and an N-type impurity are diffused into the surface region of the N-type base region 13 consecutively and selectively, sequentially forming the P-type base region 14 and the emitter region 15 as shown in FIG. 2E.

Thereafter, the collector electrode 17, the emitter electrode 18, the gate electrode 20 and so forth are formed at the semiconductor substrate 16 obtained in the above-described manner, yielding the IGBT 10 as shown in FIG. 1.

The employment of the above-described structure can provide a fabrication method for an insulated gate bipolar transistor which has a high reliability and a high switching speed. The employment of the structure can also provide an insulated gate bipolar transistor, which has an arsenic-contained buffer region and has a high reliability and a high switching speed, and a method of fabricating the transistor.

The present invention is not limited to the embodiment, but can be modified and adapted in various forms. For example, while the foregoing description has explained the case where the collector region 11 contains boron as a P-type impurity, boron is not restrictive and the present invention can be effectively adapted to a case where any impurity having a greater diffusion coefficient than that of arsenic is used. Although the foregoing description has discussed the case where arsenic is diffused into the buffer region 12, an N-type impurity different from arsenic can be diffused.

The foregoing description has discussed the case where the anti-diffusion region 22 is formed as a non-doped silicon epitaxial growth layer. The anti-diffusion region 22 may however be formed as a P-type diffusion region containing a P-type impurity if the impurity concentration is sufficiently lower than the P-type impurity concentration of the collector region 11.

Likewise, the anti-diffusion region 22 may be formed as an N-type diffusion region which has a sufficient impurity concentration to invert the conductivity type of the N-type diffusion region by diffusion of the P-type impurity from the collector region 11. In this case, an N-type epitaxial layer having such an impurity concentration may be formed on the collector region 11 with a thickness equal to the sum of the thicknesses of the anti-diffusion region 22 and the buffer region 12, then an N-type impurity may be diffused into the N-type epitaxial layer to form the buffer region 12 with a high impurity concentration.

The anti-diffusion region 22 has only to substantially prevent diffusion of an N-type impurity such as boron contained in the collector region 11 into the N-type base region 13. Therefore, the anti-diffusion region 22 may be added with a material which is easily combined with boron or so, or may be a compound semiconductor layer into which boron or so is easily diffused. The anti-diffusion region 22 may be formed by bonding, not by epitaxial growth.

The distribution of the impurity concentration in the thickness wise direction of the substrate of the IGBT prepared according to the embodiment was examined. A dotted line in FIG. 3 shows the distribution of the impurity concentration before the P-type base region, etc. are formed and when the N-type base region is formed.

In the examination, the thicknesses of the collector region, the anti-diffusion region, the buffer region and the N-type base region were respectively set to 200 μm, 2 μm, 5 μm and 50 μm, and the impurity concentrations of the collector region, the buffer region and the N-type base region were respectively set to $1 \times 10^{18}$ cm$^{-3}$, $5 \times 10^{17}$ cm$^{-3}$ and $1 \times 10^{14}$ cm$^{-3}$.

As illustrated in the diagram, while the anti-diffusion region is a non-doped region before formation of the device, an impurity (boron) is diffused into at a concentration having a slope due to diffusion of the impurity from the collector region after formation of the device. It is also apparent that the anti-diffusion region substantially stops such diffusion of boron toward the buffer region, thus preventing diffusion of boron into the N-type base region. In short, the IGBT with the anti-diffusion region according to the embodiment of the present invention keeps high breakdown voltage characteristics, such as prevention of diffusion of boron into the N-type base region and inhibition of the breakdown voltage characteristic to follow the channel pattern.

Various embodiments and changes may be made there unto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2003-390080 filed on Nov. 20, 2003, and including the specification, claims, drawings and summary. The disclosure of the above Japanese Patent Application is incorporated herein by reference in its entirety.

What is claimed is:

1. An insulated gate bipolar transistor comprising:
a P-type collector region containing a P-type impurity;
an N-type buffer region formed on said P-type collector region;
an N-type base region formed on said N-type buffer region and having a lower impurity concentration than said N-type buffer region;
a P-type base region formed in a surface region of said N-type base region;
an N-type emitter region formed in a surface region of said N-type base region; and
an anti-diffusion region formed between said P-type collector region and said N-type buffer region in such a way as to prevent diffusion of said P-type impurity of said P-type collector region;
wherein said N-type buffer region (12) has a thickness of 2 μm to 10 μm or less and an impurity concentration of $5 \times 10^{17}$ cm$^{-3}$ or higher.

2. The insulated gate bipolar transistor according to claim 1, wherein arsenic is diffused in said N-type buffer region.

3. The insulated gate bipolar transistor according to claim 1, wherein said anti-diffusion region prevents diffusion of said P-type impurity of said P-type collector region into said N-type base region.

4. The insulated gate bipolar transistor according to claim 1, wherein said anti-diffusion region prevents said P-type impurity of said P-type collector region from being diffused over an interface between said anti-diffusion region and said N-type buffer region.

5. The insulated gate bipolar transistor according to claim 1, wherein said anti-diffusion region is formed as an epitaxial growth layer containing no impurity.

6. The insulated gate bipolar transistor according to claim 1, wherein said anti-diffusion region is formed as a semiconductor region having a lower P-type impurity concentration impurity than that of said P-type collector region.

7. The insulated gate bipolar transistor according to claim 1, wherein said anti-diffusion region is formed as an N-type semiconductor region having an impurity concentration which allows a conductivity type of said N-type semiconductor region to be inverted by diffusion of said P-type impurity from said P-type collector region in a device fabrication process.

8. The insulated gate bipolar transistor according to claim 1, wherein said P-type impurity of said P-type collector region is boron.

9. A method of fabricating an insulated gate bipolar transistor comprising the steps of:
forming an anti-diffusion region on a P-type collector region containing a P-type impurity to prevent diffusion of said P-type impurity in a device fabrication process;
forming an N-type buffer region on said anti-diffusion region;
forming an N-type base region having a tower impurity concentration than said N-type buffer region on said N-type buffer region;
forming a P-type base region in a surface region of said N-type base region by impurity diffusion; and
forming an N-type emitter region in a surface region of said N-type base region by impurity diffusion;
wherein said anti-diffusion region is formed in such a way that a thickness of said anti-diffusion region is set equal to or smaller than a distance of diffusion of said P-type impurity of said P-type collector region in a device fabrication process.

10. The method according to claim 9, wherein arsenic is diffused as an N-type impurity in said N-type buffer region.

11. The method according to claim 9, wherein said anti-diffusion region is formed as an epitaxial growth layer containing no impurity.

12. The method according to claim 9, wherein said anti-diffusion region is formed as a semiconductor region having a lower P-type impurity concentration impurity than that of said P-type collector region.

13. The method according to claim 9, wherein said anti-diffusion region is fanned as an N-type semiconductor region having an impurity concentration which allows a conductivity type of said N-type diffusion region to be inverted by diffusion of said P-type impurity from said P-type collector region in a device fabrication process.

14. The method according to claim 9, wherein boron is used as said P-type impurity contained in said P-type collector region.

15. A method of fabricating an insulated gate bipolar transistor comprising the steps of:
forming an anti-diffusion region on a P-type collector region containing a P-type impurity to prevent diffusion of said P-type impurity in a device fabrication process;
forming an N-type buffer region on said anti-diffusion region;
forming an N-type base region having a lower impurity concentration than said N-type buffer region on said N-type buffer region;
forming a P-type base region in a surface region of said N-type base region by impurity diffusion; and
forming an N-type emitter region in a surface region of said N-type base region by impurity diffusion;
wherein said anti-diffusion region and said N-type buffer region are formed in such a way that a sum of a thickness of said anti-diffusion region and a thickness of said N-type buffer region is set equal to or greater than a distance of diffusion of said P-type impurity of said P-type collector region in a device fabrication process.

16. A method of fabricating an insulated gate bipolar transistor comprising the steps of:
forming an anti-diffusion region on a P-type collector region containing a P-type impurity to prevent diffusion of said P-type impurity in a device fabrication process;
forming an N-type buffer region on said anti-diffusion region;
forming an N-type base region having a lower impurity concentration than said N-type buffer region on said N-type buffer region;
forming a P-type base region in a surface region of said N-type base region by impurity diffusion; and
forming an N-type emitter region in a surface region of said N-type base region by impurity diffusion;
wherein said N-type buffer region has a thickness of 2 μm to 10 μm or less and an impurity concentration of $5 \times 10^{17}$ cm$^{-3}$ or higher.

* * * * *